(12) United States Patent
Shimizu et al.

(10) Patent No.: US 8,137,147 B2
(45) Date of Patent: Mar. 20, 2012

(54) ORGANIC ELECTROLUMINESCENCE DISPLAY AND METHOD FOR MANUFACTURING THE SAME

(75) Inventors: Takahisa Shimizu, Tokyo (JP); Koji Takeshita, Tokyo (JP); Hironori Kawakami, Tokyo (JP); Nahoko Inokuchi, Tokyo (JP)

(73) Assignee: Toppan Printing Co., Ltd. (JP)

( * ) Notice: Subject to any disclaimer, the term of this patent is extended or adjusted under 35 U.S.C. 154(b) by 351 days.

(21) Appl. No.: 12/211,785

(22) Filed: Sep. 16, 2008

(65) Prior Publication Data

US 2009/0108739 A1    Apr. 30, 2009

(30) Foreign Application Priority Data

Oct. 30, 2007   (JP) .................................. 2007-281167

(51) Int. Cl.
*H01J 9/24* (2006.01)
(52) U.S. Cl. ........................... 445/24; 313/504; 313/506
(58) Field of Classification Search .......... 313/498–512; 445/24
See application file for complete search history.

(56) References Cited

U.S. PATENT DOCUMENTS

| 4,952,481 | A * | 8/1990 | Seio et al. ................... 430/284.1 |
| 6,366,025 | B1 * | 4/2002 | Yamada ...................... 315/169.3 |
| 6,747,618 | B2 * | 6/2004 | Arnold et al. ................... 345/77 |
| 2003/0030370 | A1 * | 2/2003 | Tada .............................. 313/504 |
| 2005/0242712 | A1 * | 11/2005 | Sung ............................. 313/503 |
| 2006/0232202 | A1 * | 10/2006 | Matsuda et al. .............. 313/506 |
| 2006/0238113 | A1 * | 10/2006 | Kashiwabara et al. ....... 313/504 |

FOREIGN PATENT DOCUMENTS

| JP | 2001-093668 | 4/2001 |
| JP | 2001-155858 | 6/2001 |
| JP | 2001-155861 | 6/2001 |

* cited by examiner

*Primary Examiner* — Bumsuk Won
(74) *Attorney, Agent, or Firm* — Squire Sanders (US) LLP

(57) ABSTRACT

A method for manufacturing an organic electroluminescence display includes forming a first electrode, forming an organic light emitting medium layer including an organic light emitting layer on the first electrode, the respective organic light emitting medium layers including respective organic light emitting layers having different life-times in light emitting, and forming a second electrode on the organic light emitting medium layer, wherein the organic light emitting layer having a longer life-time is formed earlier.

5 Claims, 3 Drawing Sheets

ORGANIC ELECTROLUMINESCENCE DISPLAY AND METHOD FOR MANUFACTURING THE SAME

CROSS REFERENCE

This application is based upon and claims the benefit of priority from the prior Japanese Patent Application No. 2007-281167, filed on Oct. 30, 2007, the entire contents of which are incorporated herein by reference.

BACKGROUND OF THE INVENTION

1. Field of the Invention

The present invention is related to an organic EL display and a method for manufacturing an organic EL display. Especially, the present invention is related to an organic EL display and a method for manufacturing an organic EL display, in which luminance degradation and life-time reduction are controlled by forming finally a blue polymer organic EL light emitting material because luminance degradation and life-time reduction of blue color polymer organic EL light emitting material in air is remarkable.

2. Description of the Related Art

An organic EL element emits light when a current is supplied to a light emitting layer which is formed from an organic light emitting material and between two opposed electrodes, and, in order to achieve efficient light emission, it is important to keep a film thickness of the organic light emitting layer to about 100 nm. Further, in the case of forming a display from the organic EL element, it is necessary to perform patterning of the organic EL element with high definition.

As the organic light emitting material for the light emitting layer formed on a substrate or the like, a low molecular material and a high molecular (polymer) material are usable. The low molecular material is subjected to resistive heating vapor deposition and the like to form a thin film, and at the same time the patterning is performed by using a microscopically patterned mask. However, this method has a problem that patterning accuracy is reduced with an increase in size of a substrate.

Therefore, the high molecular material has recently been used as the organic light emitting material, and a method of forming a thin film by wet coating with a coating liquid obtained by dispersing or dissolving the organic light emitting material into a solvent has been tried.

As the wet coating method for the thin film formation, spin coating, bar coating, projection coating, dip coating, and the like are known. However, the wet coating methods have difficulty in realizing the high definition patterning and color coding with R, G, and B, and it is considered that the thin film is most effectively formed by a printing process that is capable of achieving excellent color coding and patterning.

It is often that an organic electroluminescence element or a display uses a glass substrate as a substrate. Thus, a method to use a metal hard printing plate such as a gravure printing method is unsuitable. Offset printing to use rubber blanket having elasticity and relief printing method to use rubber printing plate and photosensitive resin printing plate having elasticity are suitable. As attempt by these printing methods, a method (Japanese Patent Laid-Open No. 2001-93668 Official Gazette) by offset printing and a method (Japanese Patent Laid-Open No. 2001-155858 Official Gazette) by relief printing are really proposed.

It is known that there is the most suitable viscosity in an ink of a viscous type (in other word, thixotropy type) or a liquid type used for a relief printing method. Especially, a viscosity modifier such as a thickener or a surface activating agent for adjusting a surface tension is generally added to a liquid type ink.

In the case where electronic materials are printed, solubility thereof may be limited or impurity may be not preferably included therein.

Especially, when a film is formed by printing an organic light emitting material using a printing method, an organic light emitting material is dispersed or dissolved in a solvent such as a water, an alcohol or an organic solvent (including a binder resin if necessary), thereby an ink for printing or coating is made.

It is said that, in a case where a pattern of a film of an organic light emitting material is formed and the pattern is made to emit light in a element, the higher the purity of a film made of an organic light emitting material is, the better the durability of an element is. Therefore, since the remained thickener or the like lowers the purity, the thickener or the like can not be included in an ink. Therefore, from this reason, some adjustable properties of an organic light emitting material ink are limited, the some adjustable properties being for achieving an ink transfer property of a printed matter and achieving stability of a pattern shape.

From the above-mentioned reason and low solubility of especially light emitting material case, only some kinds of aromatic solvents can be used, thereby range of choice in inks is not so broad.

In addition, in the case where a light emitting material film is only exposed to air after the film formation, the film may be degraded while intensity of emitted light may decreased. Especially, as for generally used polymer organic EL light emitting material, life-time thereof in the case the material is used for a display is not sufficient for an assured performance. However, this fact depends on a kind of a display.

Further, under such a situation, if blue color materials are compared with red or green color materials, blue color materials has essentially shorter life-time. Further, there is a problem in which blue color materials are remarkably degraded by outside light or air.

The object of the present invention is to provide an organic EL display and a method for manufacturing an organic EL display. In this organic EL display, luminous degradation and reduction of life-time can be control led by forming last a blue polymer organic light emitting material pattern last since luminous and life-time of a blue polymer organic light emitting material are remarkably degraded in air.

[Patent document 2] JP-A-2001-93668
[Patent document 3] JP-A-2001-155858
[Patent document 1] JP-A-2001-155861

SUMMARY OF THE INVENTION

One embodiment of the present invention is a method for manufacturing an organic electroluminescence display including forming a first electrode, forming an organic light emitting medium layer including an organic light emitting layer on the first electrode, the respective organic light emitting medium layers including respective organic light emitting layers having different life-times in light emitting, and forming a second electrode on the organic light emitting medium layer, wherein the organic light emitting layer having a longer life-time is formed earlier.

Figure 1:
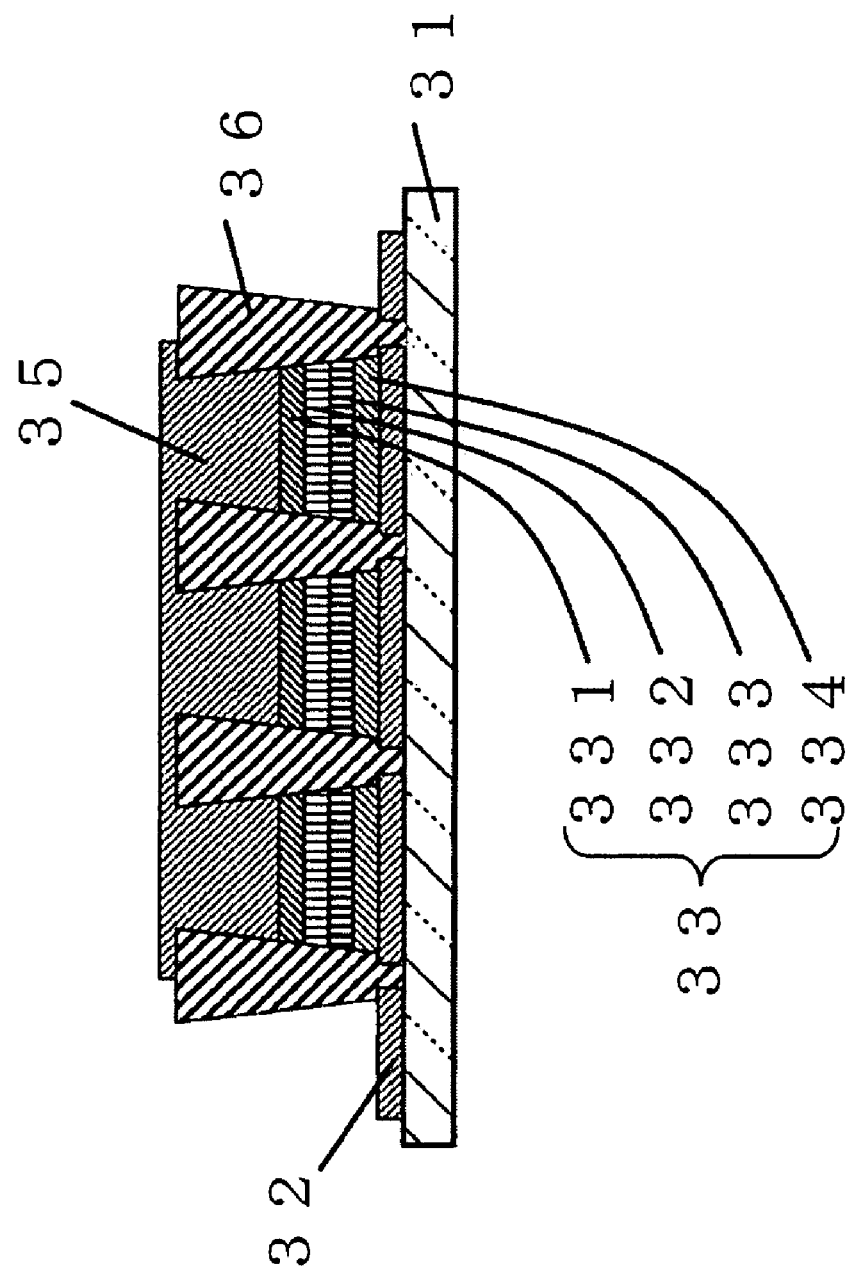
FIG. 1 is a schematic cross-sectional view of an embodiment of an organic EL display of the present invention.

In these drawings, 1 is a relief printing machine; 2 is an ink tank; 3 is an ink discharging part (chamber); 41 is an ink; 42 is an ink; 43 is an ink; 5 is an anilox roll (an ink supplying roller); 6 is a plate cylinder; 7 is a substrate (a substrate to be printed); 8 is a stationary surface plate for a substrate; 9 is a doctor; 10 is a relief printing plate; 11 is a base material layer; 12 is a convex part forming material layer (a convex part); 30 is an organic EL display; 31 is a substrate; 32 is a first electrode; 33 is an organic light emitting medium layer; 331 is an electron injection layer; 332 is an organic light emitting layer; 333 is a hole transport layer; 334 is a hole injection layer: 35 is a second electrode; and 36 is a partition wall.

DETAILED DESCRIPTION OF THE INVENTION

Hereinafter, embodiments of the present invention are described in detail referring to figures. In embodiments, same elements have an identical reference numeral. Overlapping explanations in embodiments are omitted. In addition, the present invention is not limited to these embodiments.

The present invention is related to a printing order in which electronic materials are printed by a relief printing method. As shown in FIG. 1, an embodiment of an organic EL display 30 of the present invention has a substrate 31, a first electrode 32 formed on a substrate 31, a hole injection layer 334 formed on a first electrode 32, a hole transport layer 333 formed on a hole injection layer 334, an organic light emitting layer 332 formed on a hole transport layer 333, an electron injection layer 331 formed on an organic light emitting layer 332, a second electrode 35 formed on an electron injection layer 331, and further a partition wall (an insulating layer) 36 which insulates neighboring electrodes from each other.

An organic EL display 30 can be preferably used for a passive matrix driving type organic EL display. The passive driving type organic EL display has an organic light emitting medium layer 33, a first electrode (a transparent electrode) 32 and a second electrode (a counter electrode) 35. The organic light emitting medium layer 33 is sandwiched between the first electrode and the second electrode. The first electrode 32 intersects with the second electrode 35. The respective electrodes are an anode or cathode. At the intersection point, light emits.

In addition, an organic EL display can be preferably used for an active matrix driving type organic EL display. The active matrix driving type organic EL display has a thin film transistor (TFT) for driving the display on respective pixels in which a first electrode (a transparent electrode) 32 or a second electrode (a counter electrode) 35 is a pixel electrode. Light emits when electric current flows through a pixel by this thin film transistor.

In the case where a substrate 31 side is a display side, a substrate 31 is not particularly limited as long as it is a substrate having translucency and a certain level of strength, and specifically, a glass board, or a plastic film or sheet can be used. When a thin glass board having a thickness of 0.2 to 1 mm is used, a thin organic EL display 30 having extremely high barrier properties can be produced.

As a formation material of a first electrode 32, transparent or semitransparent conductive material is preferably used.

When a first electrode 32 is an anode, for example, complex oxide (ITO) of indium and tin, complex oxide (IZO) of indium and zinc, tin oxide, zinc oxide, indium oxide or zinc aluminum complex oxide can be used. However, usable materials are not limited to these.

ITO can be preferably used from the following reason: Electrical resistance is low; Solvent resistance is high; and Transparency is high. ITO can be layered by evaporation or a sputtering method on a substrate 31.

It is also possible to form the first electrode by coating a precursor such as indium octylate or acetone indium on a substrate 31 and then performing a coating pyrolysis method for forming an oxide by thermal decomposition. Alternatively, it is possible to use a metal such as aluminum, gold, silver, or the like in a translucent state provided by vapor deposition. Further, an organic semiconductor such as polyaniline may be used.

A first electrode 32 may be patterned by etching or subjected to surface activation by a UV treatment, a plasma treatment, or the like when so required.

Organic light emitting medium layer 33 is selected from plural functional layers. For example, a hole injection layer 334, a hole transport layer 333, an organic light emitting layer 332, a hole blocking layer (not illustrated in figures), an electron transport layer (not illustrated in figures), an electron injection layer 331 and the like are exemplified.

Organic light emitting medium layer 33 had better have an organic light emitting layer 332 and other one or more functional layer(s) to obtain sufficient luminous efficiency, emission brightness and life time.

In FIG. 1, hole injection layer 334, hole transport layer 333, organic light emitting layer 332 and electron injection layer 331 are selected as organic light emitting medium layer 33. However, layer structure can be selected arbitrarily.

For a hole injecting material and a hole transport material used for a hole injection layer 334 and a hole transport layer 333, the material which is generally employed as hole transport material can be preferably used.

For example, copper phthalocyanine and the derivative, aromatic amine system such as 1,1-bis(4-di-p-tolylaminophenyl)cyclohexane, N, N'-diphenyl-N,N'-bis(3-methylphenyl)-1,1'-biphenyl-4,4'diamine (TPD) and triphenylamines can be used for low molecular material.

Film formation is possible by dry process in a vacuum condition such as vacuum evaporation method using these materials.

In addition, a hole injection ink and a hole transport ink can be made by dispersing and/or dissolving these materials in solvents such as toluene, xylene, acetone, anisole, methyl anisole, dimethylanisole, benzoic ether, methyl benzoate, mesitylene, Tetralin, amyl benzene, methyl ethyl ketone, methyl isobutyl ketone, cyclohexanone, methanol, ethanol, isopropanol, ethyl acetate, butyl acetate, cyclohexanol or water. In addition, a mixed solvent can be used.

Film formation is possible by wet process under an atmospheric air using these inks.

In addition, as polymeric material, polyaniline, polythiophene, polyvinyl carbazole, a mixture of poly (3,4-ethylenedioxy thiophen) and polystyrene sulfonate, PPV derivative or PAF derivative can be used.

A hole injection ink and a hole transport ink can be made by dispersing and/or dissolving these hole injection materials and hole transport materials in solvents such as toluene, xylene, acetone, methyl ethyl ketone, methyl isobutyl ketone, cyclohexanone, methanol, ethanol, isopropanol, ethyl acetate, butyl acetate, cyclohexanol and water. In addition, mixed solvent can be used.

Film formation is possible by wet process under an atmospheric air using these inks.

Further, an inorganic hole transport layer 333 can be formed by using inorganic materials such as $Cu_2O$, $Cr_2O_3$, $Mn_2O_3$, $FeO_x(x\sim0.1)$, $NiO$, $CoO$, $Pr_2O_3$, $Ag_2O$, $MoO_2$, $Bi_2O_3$, $ZnO$, $TiO_2$, $SnO_2$, $ThO_2$, $V_2O_5$, $Nb_2O_5$, $Ta_2O_5$, $MoO_3$, $WO_3$ and $MnO_2$ by a vapor deposition method or a sputtering method.

As light emitting materials used for a light emitting layer 332, those obtainable by dissolving a low molecular fluorescent dye into a polymer such as polystyrene, polymethylmethacrylate, polyvinylcarbazole and polymer light emitters such as a polyphenylenevinylene (PPV) derivative and a polyalkylfluorene (PAF) derivative are usable.

Since it is possible to form a film from these high molecular (polymer) light emitting materials (high molecular light emitting materials for EL elements) by a coating process or a printing process by dissolving the high molecular material into a solvent to make an ink, the high molecular light emitting materials have advantages of enabling film formation in the atmosphere and low installation cost as compared to cost in manufacturing the organic EL display using the low molecular materials.

It is desirable that an organic light emitting layer having a longer life-time be formed earlier. In the case where blue, green and red are used, for example, blue layer is formed last. In addition, it is desirable that an organic light emitting layer comprised of a light emitting material having a largest band gap (for example, blue material) be formed last.

Forming order of organic light emitting layer 332 can be decided based on life-times light emitting which are measured where respective light emitting color materials are applied under an identical condition so that an organic light emitting element is formed. In the application condition of this case, time between an application step and a next step (for example, drying step) is especially important. The application method is not needed to be same as a printing method which is used for forming an organic light emitting layer. For example, a wet process such as a spin coating method other than a printing method can be used.

As an electron injection layer 331, alkaline earth metals, alkali metal such as lithium fluoride or lithium oxide, or salt or oxide of alkaline earth metals can be preferably used.

As for these materials, film formation by dry process in a vacuum condition such as vacuum deposition is possible.

A thickness of respective layers of an organic light emitting medium layer 33 is not limited. However, it is desirable that the thickness be 50 nm-200 nm.

In the case where a second electrode 35 is a cathode, an elemental metal such as Mg, Al or Yb may be used. Also, for the purpose of achieving both electron injection efficiency and stability, an alloy system of a metal having a low work function with a stable metal, for example, an alloy such as MgAg, AlLi or CuLi, can be used.

As for the formation method of a cathode, depending on the material, vacuum evaporation methods such as a resistance heating evaporation method, an electron beam method or a sputtering method can be used. However, usable methods are not limited to these.

It is preferable for the thickness of a cathode to be about 10 nm-1,000 nm.

In FIG. 1, at first, an anode is laminated on substrate 31. However, at first, a cathode can be laminated on substrate 101.

In addition, in FIG. 1, substrate 31 side is the display side. However, opposite side of substrate 31 side may be the display side.

After a first electrode 32 is preferably formed, a partition wall 36 can be formed between neighboring electrodes by, for example, a photolithography method using a photosensitive material, if necessary.

Spreading of a coating liquid including a material of an organic light emitting medium layer 303 can be controlled by partition wall 36 between adjacent electrodes.

Especially, color mixture of an organic light emitting layer 332 can be prevented. In addition, electric current is prevented from flowing to an adjacent electrode.

Both a positive type resist and a negative type resist can be used as a photosensitive material for forming a partition wall 36. As a material having an insulating property, materials such as polyimide system, an acryl resin system or novolak resin system can be used. However, the usable material is not limited to these materials.

In addition, light shielding materials may be included in the photosensitive materials for the purpose of improving display quality of an organic light emitting display 30. Further, liquid-repellent materials may be included in the photosensitive materials for the purpose of preventing a coating liquid from spreading to a partition wall 36.

A photosensitive resin for forming a partition wall 36 can be applied to a substrate by application methods such as a spin coating method, a bar coating method, a roll coating method, a die coating method or a gravure coating method.

When a spin coater is used, a film having a desired thickness may not be obtained by applying an ink one time. In that case, by repeating a similar process multiple times, a film having a desired thickness can be obtained.

The surface of the partition wall 36 can be made liquid repellent by performing processing such as plasma cleaning or UV cleaning for the obtained partition wall 36 if necessary.

A sealing substrate can be provided so as to cover a first electrode 32, an organic light emitting medium layer 33, a second electrode 35, these members being laminated, and a partition wall 36 although the sealing substrate is not illustrated in figures. When gases around an organic EL display 30 enter the display 30, the gases influence life-time of an organic light emitting medium layer 33. Especially, water (moisture) or oxygen causes degradation of metal electrodes. Thereby, non-light emitting areas called dark spots occur. Therefore, a sealing substrate is provided to achieve a barrier property against moisture or oxygen.

Figure 2:
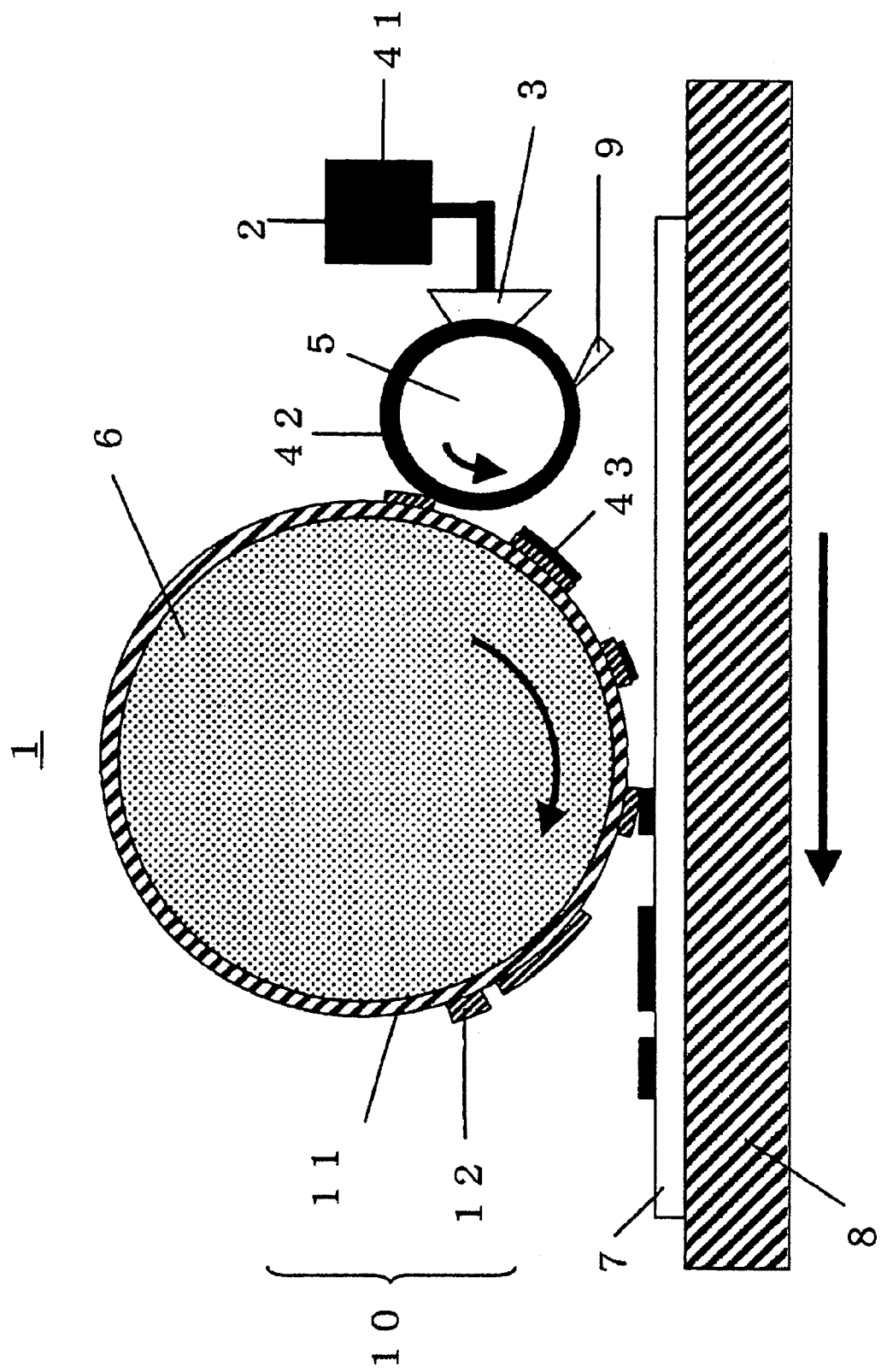
FIG. 2 is a schematic diagram of a relief printing machine used in the present invention.

In a relief printing method used in the present invention, a cylindrically pressing type relief printing machine 1 shown in FIG. 2 or a cylindrically pressing type relief offset printing machine (not illustrated in figures) can be used. However, usable machines in the present invention are not limited to these.

A cylindrically pressing type relief printing machine shown in FIG. 2 has an ink tank 2, an ink discharging part 3 (chamber) which supplies an ink, an anilox roll 5 which rotates in a direction shown by an arrow, the anilox roll 5 including a hard type roll made of a metal or a resin, or a soft type elastic roll, and plate cylinder, a relief printing plate 10, and a plate cylinder 6 having a relief printing plate 10 thereon, the cylinder rotating in a direction shown by an arrow. There is surface table 8, under the plate cylinder 6, for fixing a substrate 7 to be printed, the surface table 8 reciprocating in a direction shown by an arrow (in a horizontal direction). Here, a relief printing plate 10 has a base substrate layer 11 and a convex part forming material layer 12 on a base substrate layer 11. Hereinafter, a convex part forming material layer 12 may be simply called as a convex part 12.

An ink 41 is taken to ink tank 2. An ink 41 in ink tank 2 is set to ink discharging part 3. Anilox roll 5 is located near ink discharging part 3 and rotates while touching a relief printing plate 10 on a plate cylinder 6.

According to the rotation of anilox roll 5, ink 42 discharged on a surface of anilox roll 5 from ink discharging part 3 becomes uniform in film thickness by scraping by doctor 9, thereafter ink 42 having a uniform film thickness on a surface of anilox roll 5 is transferred to a top surface of convex part 12 of relief printing plate 10.

Further, substrate 7 (a substrate to be printed) on surface table 8 is horizontally moved in a left direction of the figure to a printing starting point, as shown in FIG. 2, while a phase position is adjusted by a position adjusting mechanism which adjusts a phase position of convex patterns comprising convex part 12 of relief printing plate 10 with relative to substrate 7.

Thereafter, surface table 8 is horizontally moved in right direction of the figure in accordance with the rotation speed of plate cylinder 6 while convex part 12 of relief printing plate 10 on plate cylinder 6 touches substrate 7 in a state that a desired printing pressure is applied, thereby convex patterns comprising ink 43 on top surface of convex part 12 of relief printing plate 10 is printed on a surface of substrate 7.

After printing, substrate 7 is removed from surface table 8. Thereafter next substrate 7 is fixed on surface table 8. By the repeating these processes, printing is performed.

In addition, cylindrically pressing type relief printing machine comprises a cylinder type blanket cylinder and a flat surface table which is fixed and place at a predetermined position, both members being not illustrated in a figure. This machine has the following members in detail a flat surface table for fixing horizontally flat relief printing plate 10 at a predetermined position; a flat surface table 8 for fixing horizontally a substrate (a substrate to be printed) at a predetermined position; an ink supplying roller which put an ink on top surface by moving, rotating and touching on a surface of relief printing plate 10 placed and fixed on a surface table for fixing relief printing plate 10; and a blanket cylinder, wherein an ink on top surface is transferred to a blanket whose surface is made of rubber, by the blanket rotating and moving on a surface of relief printing plate 10 in a stand by mode of an ink supplying roller, and further an ink transferred on a surface of a blanket is transferred to a substrate (a substrate to be printed) by a blanket cylinder rotating and moving, thereby printing is performed.

Figure 3:
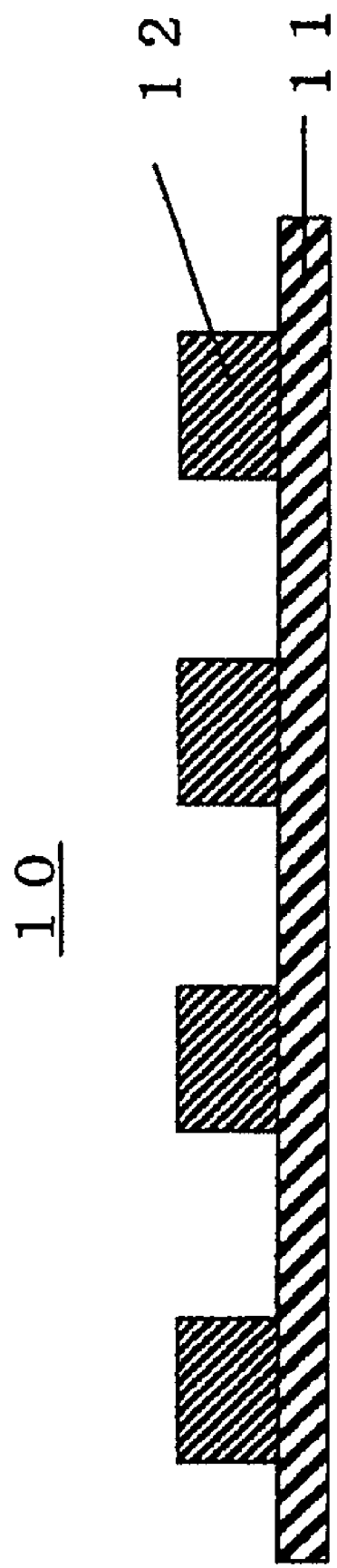
FIG. 3 is a schematic cross-sectional side view of a relief printing plate used in the present invention.

FIG. 3 is a schematic cross-sectional side view of a relief printing plate 10 for manufacturing an organic EL light emitting layer 332 of an embodiment of the present invention. A relief printing plate 10 has a base substrate layer 11 and a convex part formation material layer 12 formed on a base substrate layer 11.

Rubbers such as butadiene acrylonitrile rubber, silicone rubber, isoprene rubber, styrene-butadiene rubber, butadiene rubber, chloroprene rubber, isobutylene-isoprene rubber, acrylonitrile rubber, ethylene propylene rubber and urethane rubber, synthetic resins such as polyethylen, polystyrene, polybutadiene, polyvinyl chloride, polyvinylidene chloride, polyvinyl acetate, polyamide, polyethersulfone, polyethylene terephthalate, polyethylenenaphthalate, polyethersulfone, polyvinyl alcohol and copolymer thereof, and natural polymers such as cellulose can be used for materials of a relief printing plate 10. However, usable materials are not limited to these.

Especially, it is desirable that a material including a water-soluble polymer as a main component should be used, since the material has high resistance to an organic solvent which constitutes a solution or a dispersion of an organic light emitting material which is a component of an ink.

Here, for example, as a coating ink liquid of an organic light emitting material which is one of electronic materials, the lower the boiling point is, the easier the drying process is performed. However, if time for a printing process is considered, in the case where a solvent having a too low boiling point is used, an ink is dried on an upper part of a relief printing plate. Therefore, ink is reasonably mixed with a solvent having a boiling point of 130 degrees Celsius or more. Thereby, ink is prevented from drying.

Examples of solvents having a boiling point of 130 degrees Celsius or more include 2,3-dimethylanisole, 2,5-dimethylanisole, 2,6-dimethylanisole, trimethyl anisole, tetralin, methyl benzoate, ethyl benzoate, cyclohexylbenzene, n-amyl benzene, tert-amyl benzene, diphenyl ether and dimethyl sulfoxide. One or a plurality kinds of solvent can be selected among them. However, usable solvents are not limited to these.

The above-mentioned materials can be used for a relief printing plate 10. However, a flexo printing plate or a resin type relief printing plate which is commercially available can be used for a relief printing plate 10.

A printing machine equipped with a relief printing plate 10 can be used for printing in a relief printing method. For example, a relief printing plate 10 can be equipped with a cylindrically pressing type relief printing machine or a cylindrically pressing type relief offset printing machine to perform printing.

A polymer organic EL light emitting material of blue color is remarkably degraded in air. That is, both life-time and luminance becomes lowered. The longer the life-time of an organic light emitting material is, the earlier an organic light emitting material is formed. Thereby, an organic EL display and a method for manufacturing the display can be provided in which luminance degradation and life-time reduction can be controlled.

EXAMPLES

Hereinafter, the present invention is further described by Examples and Comparative Examples. However, the present invention is not limited to these.

Example 1

Printing a Pattern of 180 ppi (Preparation of a Coating Ink Liquid for Forming an Organic Light Emitting Layer 332)

A polymer fluorescent material with a polymer resin as a binder is dissolved in a solvent. Thereby, a coaling ink liquid was obtained in which a concentration of a polymer fluorescent material was 2.0 wt %. In this way, a coating ink liquid for forming an organic light emitting layer 332 was prepared. Here, as a polymer fluorescent material, light emitting materials of three colors comprised of poly fluorenes were used. As for a composition of a solvent in the ink, xylene (boiling point: 139 degrees Celsius) of 88 wt % and cyclohexylbenzene (boiling point: 239 degrees Celsius) of 10 wt % were used.

(Preparation of a Substrate 7)

A substrate for forming a transparent electrode was prepared by forming a circuit-pattern shaped ITO film having a surface resistivity of 15Ω on a square glass substrate 31 (a product of GEOMATEC CO., LTD.) having a thickness of 0.4 mm and one side length of 150 mm. A first electrode 32 was formed as an anode.

Next, poly (3,4) ethylenedioxy thiophene/polystyrene sulfonate (PEDOT/PSS) was formed to 100 nm film thickness by a spin coating method on the film surface of ITO of a first electrode 32. Thereby, a hole transport layer 333 was formed. Further, the PEDOT/PSS thin film was dried for 1 hour in a reduced pressure at 180 degrees Celsius. Thereby, a substrate 7 was prepared.

(Preparation of a Relief Printing Plate 10)

A forming layer of a convex part 12 was formed to 0.1 μm thickness by applying a photosensitive water-soluble polymer (a water-soluble resin) on a polyethylene terephthalate (PET) substrate having a thickness of 0.3 mm as a base substrate layer 11, the polymer melted by heating at 150 degrees Celsius.

(Pattern Formation of a Relief Printing Plate 10)

A convex formation part and a concave part of a relief printing plate 10 were formed by a photolithography method, wherein L/S=25/116 μm (this value was corresponding to 180 ppi) This was a line-shaped pattern. Printings of red color, green color and blue color were performed by using this pattern while printing positions are shifted for every colors. Thereby, a full-color panel of RGB could be manufactured.

(Decision of Forming Order of Organic Light Emitting Layers)

Before forming elements by a printing method, an organic light emitting layer of non-patterned was formed by a spin coating method using an organic light emitting forming ink liquid of each color under an identical application condition. Thereby, organic light emitting elements were manufactured. Life-times of these elements were measured, and printing order was decided. The results were shown in Table 1.

(Printing a Coating Ink Liquid for Forming an Organic Light Emitting Layer 332 by a Relief Printing Plate 10)

First of all, a relief printing plate 10 of the present invention shown in FIG. 1 was equipped with a surface of plate cylinder 6 of a cylindrically pressing type printing machine 1 (See FIG. 1) and substrate 7 (substrate to be printed) was placed and fixed on a surface table 7.

Next, by rotating anilox roll 5 of 500 lines/an inch and plate cylinder 6, an ink 42 for forming a light emitting layer was supplied on a surface of anilox roll 5 (an ink supplying roller) so that film thickness of an ink was uniform. Thereafter, through anilox roll 5, ink liquid 42 was supplied on top surface of convex part 12 of relief printing plate 10. Thereafter, a pattern-shaped red ink 42 was printed by top surface of relief printing plate 10 on a side of substrate 7 where ITO film pattern was formed so that the printed pattern corresponded to ITO film pattern.

Subsequently, printing of green ink on a substrate was performed for 10 pieces of substrates.

Subsequently, just the same, printings of red ink and blue ink on a substrate were performed in this order.

After printing of blue ink was performed, time when the blue ink was exposed to air was about 1 hour at most.

As for the printed substrate 7, the coating ink liquid 43 was dried for 5 hours at 150 degrees Celsius in a vacuum condition. Thereafter, Ba of 7 nm and Al of 150 nm as a second electrode 35 (a cathode) were formed on an organic light emitting layer 332 made from the coating ink liquid 43.

Example 2

An organic EL display 30 was manufactured by the same method as Example 1 except that a different red material and a different green material are used. In addition, printings of red color, green color and blue color are performed in this order. In this case, the order of printing was determined based on the measured results of life-times of organic EL materials formed by a spin coat method shown in Table 2. After printing of blue ink was performed, time when the blue ink was exposed to air was about 1 hour at most.

Comparative Example 1

An organic EL display 30 was manufactured by the same method as Example 1 and by using the same materials as Example 1 except that printings of blue color, green color and red color were performed in this order. After printing of blue ink was performed, time when the blue ink was exposed to air was about 8 hours at most, the time including storing time between blue color and green color and storing time between green color and red color.

Reference Example

An organic EL display without a cathode was manufactured by the same method as Example 1 and by using the same materials as Example 1. After an organic EL display was manufactured, an organic EL display was exposed to the air for 8 hours. Thereafter, a cathode was formed by the same method as Example 1.

Result

Light emitting of an organic EL display 30 of Example 1 in the case where voltage of 10 V was applied to the display through ITO thin film was observed. In the case of displaying a monochromatic red color, luminance was 1196 $cd/m^2$. In the case of displaying a monochromatic green color, luminance was 1991 $cd/m^2$. In the case of displaying a monochromatic blue color, luminance was 1613 $cd/m^2$.

Light emitting of an organic EL display 30 of Example 2 in the case where voltage of 10 V was applied to the display through ITO thin film was observed. In the case of displaying a monochromatic red color, luminance was 1220 $cd/m^2$. In the case of displaying a monochromatic green color, luminance was 1885 $cd/m^2$. In the case of displaying a monochromatic blue color, luminance was 1688 $cd/m^2$. Difference between the result of Example 1 and the result of Example 2 was little.

Light emitting of an organic EL display 30 of Comparative Example 1 in the case where voltage of 10 V was applied to the display through ITO thin film was observed. In the case of displaying a monochromatic red color, luminance was 1350 $cd/m^2$. In the case of displaying a monochromatic green color, luminance was 1876 $cd/m^2$. In the case of displaying a monochromatic blue color, luminance was 748 $cd/m^2$.

Light emitting of an organic EL display 30 of Comparative Example 2 in the case where voltage of 10 V was applied to the display through ITO thin film was observed. In the case of displaying a monochromatic red color, luminance was 1150 $cd/M^2$. In the case of displaying a monochromatic green color, luminance was 1810 $cd/m^2$. In the case of displaying a monochromatic blue color, luminance was 665 $cd/M^2$.

In the case of Comparative Example 1 and Reference Example, after a blue color pattern was formed, the pattern was exposed to air for 8 hours. Therefore, luminance of blue color became remarkably poor. Luminance of blue color in Comparative Examples 1 and 2 was insufficient for a display.

Further, in these cases, half-life period of a panel of Example 1 was 1410 hours and half-life period of a panel of Comparative Example 1 was 860 hours. It was found that luminance of Comparative Example 1 became remarkably poor. It was not observed that a certain degree of differences in red color and green color between Examples and Comparative Examples occurred.

In addition, current efficiencies are shown in Tables 1 and 2. In addition, band gaps are shown in Table 3.

TABLE 1

| Light emitting material | Current efficiency (cd/A) | | | | Life-time of light emitting (1000 nit start half life time hr) | | | |
|---|---|---|---|---|---|---|---|---|
| | Spin coating | Example 1 | Comparative Example 1 | Reference Example | Spin coating | Example 1 | Comparative Example 1 | Reference Example |
| Red A | 8.2 | 8 | 7.9 | 7.8 | 4350 | 4100 | 4050 | 3920 |
| Green A | 12.3 | 11.5 | 11.2 | 11 | 4880 | 4050 | 4480 | 4420 |
| Blue A | 7.6 | 7.2 | 6.0 | 5.8 | 1580 | 1410 | 860 | 630 |

TABLE 2

| Light emitting material | Current efficiency (cd/A) | | Life-time of light emitting (half life time hr) | |
|---|---|---|---|---|
| | Spin coating | Example 2 | Spin coating | Example 2 |
| Red A | 9.5 | 9.1 | 5500 | 4100 |
| Green A | 8.3 | 7.8 | 3880 | 3620 |
| Blue A | 7.6 | 7.4 | 1580 | 1360 |

TABLE 3

| Band gap (eV) | | | | |
|---|---|---|---|---|
| Red A | Green A | Blue A | Red B | Green B |
| 2.01 | 2.38 | 2.72 | 2.08 | 2.43 |

What is claimed is:

1. A method for manufacturing an organic electroluminescence display comprising a pixel of an electroluminescence element of a first color, a pixel of an electroluminescence element of a second color and a pixel of an electroluminescence element of a third color, the method comprising:
preparing a substrate;
forming a first electrode on the substrate;
forming a partition wall on the substrate so that the pixel is sectioned;
forming a hole transport layer on the first electrode;
forming an organic light emitting layer of the first color in the pixel of the electroluminescence element of the first color;
forming an organic light emitting layer of the second color in the pixel of the electroluminescence element of the second color;
forming an organic light emitting layer of the third color in the pixel of the electroluminescence element of the third color,
the organic light emitting layer of the first color, the organic light emitting layer of the second color and the organic light emitting layer of the third color having different life-time in light emitting,
the organic light emitting layer of the first color, the organic light emitting layer of the second color and the organic light emitting layer of the third color being not stacked on each other and being separated by the partition wall, and
forming a second electrode above the organic light emitting layer of the first color, the organic light emitting layer of the second color and the organic light emitting layer of the third color, wherein the organic light emitting layer having a longer life-time is formed earlier.

2. The method for manufacturing an organic electroluminescence display according to claim 1,
wherein the third color is blue,
and
wherein the organic light emitting layer of blue is formed last.

3. The method for manufacturing an organic electroluminescence display according to claim 1,
wherein the first color is red, the second color is green and the third color is blue,
and
wherein the organic light emitting layer of red, the organic light emitting layer of green and the organic light emitting layer of blue are formed in this order.

4. The method for manufacturing an organic electroluminescence display according to claim 1,
wherein the first color is green, the second color is red and the third color is blue,
and
wherein the organic light emitting layer of green, the organic light emitting layer of red and the organic light emitting layer of blue are formed in this order.

5. The method for manufacturing an organic electroluminescence display according to claim 1,
wherein the organic light emitting layer is formed by a printing method using a relief printing machine having a relief printing plate,
wherein a convex part of the relief printing plate comprises a photosensitive water-soluble polymer.

* * * * *